(12) United States Patent
Ueta

(10) Patent No.: US 10,411,154 B2
(45) Date of Patent: Sep. 10, 2019

(54) RAMO$_4$ SUBSTRATE AND NITRIDE SEMICONDUCTOR APPARATUS

(71) Applicant: PANASONIC CORPORATION, Osaka (JP)

(72) Inventor: Akio Ueta, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/984,801

(22) Filed: May 21, 2018

(65) Prior Publication Data

US 2018/0342644 A1 Nov. 29, 2018

(30) Foreign Application Priority Data

May 24, 2017 (JP) .................................. 2017-102862

(51) Int. Cl.
| | |
|---|---|
| *H01L 33/00* | (2010.01) |
| *H01L 21/02* | (2006.01) |
| *H01S 5/22* | (2006.01) |
| *H01L 29/20* | (2006.01) |
| *C30B 29/22* | (2006.01) |

(52) U.S. Cl.
CPC ............ *H01L 33/007* (2013.01); *C30B 29/22* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 29/2003* (2013.01); *H01S 5/2216* (2013.01)

(58) Field of Classification Search
CPC ............... H01L 33/007; H01L 29/2003; H01L 21/0254; H01L 21/0242; H01S 5/2216

USPC ................................ 257/76, 43; 438/26, 494
See application file for complete search history.

(56) References Cited

U.S. PATENT DOCUMENTS

| | | | | |
|---|---|---|---|---|
| 2010/0133470 A1* | 6/2010 | Nakahara | ................ | C30B 29/16 252/301.6 R |
| 2010/0237343 A1* | 9/2010 | Nakahara | ................ | C23C 14/08 257/43 |
| 2010/0308327 A1* | 12/2010 | Nakahara | ................ | C30B 29/16 257/43 |
| 2011/0037067 A1* | 2/2011 | Nakahara | .............. | H01L 29/045 257/43 |
| 2011/0114937 A1* | 5/2011 | Nakahara | .............. | H01L 33/285 257/43 |

(Continued)

FOREIGN PATENT DOCUMENTS

| | | |
|---|---|---|
| JP | 2008-098664 A | 4/2008 |
| JP | 2015-178448 A | 10/2015 |

*Primary Examiner* — Bo Fan
(74) *Attorney, Agent, or Firm* — McDermott Will & Emery LLP

(57) ABSTRACT

An RAMO$_4$ substrate including a single crystal represented by a general formula RAMO$_4$, wherein R represents one or more trivalent elements selected from a group consisting of Sc, In, Y, and lanthanide elements, A represents one or more trivalent elements selected from a group consisting of Fe(III), Ga, and Al, and M represents one or more divalent elements selected from the group consisting of Mg, Mn, Fe(II), Co, Cu, Zn, and Cd, in which a main plane of the RAMO$_4$ substrate has an off-angle a tilted θa° with respect to an M-axis direction from a C-plane and $0.05° \leq |\theta a| \leq 0.8°$ is satisfied.

15 Claims, 13 Drawing Sheets

(56) References Cited

U.S. PATENT DOCUMENTS

2013/0200391 A1\* 8/2013 Bedair ............... H01L 21/0237
            257/76
2017/0073840 A1\* 3/2017 Mori ...................... C30B 19/02

\* cited by examiner

RAMO₄ SUBSTRATE AND NITRIDE SEMICONDUCTOR APPARATUS

CROSS REFERENCE TO RELATED APPLICATIONS

This application is entitled to and claims the benefit of Japanese Patent Application No. 2017-102862, filed on May 24, 2017, the disclosure of which including the specification, drawings and abstract is incorporated herein by reference in its entirety.

TECHNICAL FIELD

The present disclosure relates to an RAMO₄ substrate and a group III nitride semiconductor apparatus.

BACKGROUND ART

Group III nitride semiconductors, which cover a wide band gap by means of combinations of group III elements such as Ga, Al, and In, are widely used in optical semiconductor devices such as light emitting diodes (LEDs) and laser diodes (LDs) and electronic devices for high frequency and high-power applications. These group III nitride semiconductor-containing devices are generally produced by epitaxially growing a group III nitride semiconductor layer on a sapphire substrate. However, the sapphire substrate has a large lattice mismatch of 13.8% with group III nitride semiconductors (GaN). The lattice mismatch is represented by {(Lattice constant of GaN−Lattice constant of sapphire)/Lattice constant of GaN}. Thus, there is a problem of a high defect density when a group III nitride semiconductor is epitaxially grown on the substrate. As a novel substrate to reduce the lattice mismatch described above, a ScAlMgO₄ substrate has been suggested, and a GaN epitaxial technique including the substrate has been disclosed Japanese Patent Application Laid-Open No. 2015-178448. ScAlMgO₄ has a small lattice mismatch of −1.8% with GaN. The lattice mismatch is represented by {(Lattice constant of GaN−Lattice constant of ScAlMgO₄)/Lattice constant of GaN}. Accordingly, a group III nitride semiconductor epitaxially grown on a ScAlMgO₄ substrate is likely to provide high quality and high performance, and development of such semiconductors into various group III nitride semiconductor devices is anticipated.

The ScAlMgO₄ substrate disclosed in Japanese Patent Application Laid-Open No. 2015-178448 is obtained by cleaving a ScAlMgO₄ single crystal along a C-plane ((0001) plane). Meanwhile, it is known that epitaxially growing a group III nitride semiconductor along a step edge as a level difference of atomic layer level existing on the substrate surface (hereinafter, also referred to as "step flow growth") provides a high-quality film. The surface of the ScAlMgO₄ substrate cleaved along the (0001) plane aforementioned, however, has no ideal step. Thus, the group III nitride semiconductor itself causes random nucleation on the (0001) plane during epitaxial growth, and step flow growth is induced along such nuclei. Such growth from random nuclei, which exhibits random growth directions, has a problem in that the group III nitride semiconductor surface results in rough surface morphology having large waviness.

The ScAlMgO₄ substrate having a (0001) plane produced by cleavage as the main plane includes areas having large irregularities of several hundred nm or more, depending on the cleavage accuracy, on the main plane. These large irregularities may cause faults such as defect formation in epitaxial growth.

Meanwhile, in group III nitride semiconductor growth using a sapphire substrate having a similar hetero structure, periodic steps are formed by allowing the substrate to have an off-angle to thereby step flow-grow a group III nitride semiconductor. There is disclosed use of a high-performance group III nitride semiconductor produced on such a substrate having an off-angle for formation of an LD (Japanese Patent Application Laid-Open No. 2008-98664).

SUMMARY

Technical Problem

It is then contemplated that an off-angle is provided on an RAMO₄ substrate, such as ScAlMgO₄ (R represents one or more trivalent elements selected from the group consisting of Sc, In, Y, and lanthanide elements, A represents one or more trivalent elements selected from the group consisting of Fe(III), Ga, and Al, M represents one or more divalent elements selected from the group consisting of Mg, Mn, Fe(II), Co, Cu, Zn, and Cd, and O represents Oxygen) to form periodic steps. However, when an RAMO₄ substrate, on which the height and shape of steps are specific, is allowed to have an off-angle similar to that in the case where a group III nitride semiconductor is grown on a conventional sapphire substrate or GaN substrate, it is difficult to provide a satisfactory group III nitride semiconductor layer or device.

The present disclosure has been made to solve the above problems, and an object thereof is to provide an RAMO₄ substrate having an appropriate off-angle and off direction, capable of step flow-growing a group III nitride semiconductor. The present disclosure has another object to provide an optical device, an electronic device, and the like including a group III nitride semiconductor and having satisfactory properties.

Solution to Problem

In order to solve the above problems, there is provided an RAMO₄ substrate including a single crystal represented by the general formula RAMO₄ (wherein R represents one or more trivalent elements selected from the group consisting of Sc, In, Y, and lanthanide elements, A represents one or more trivalent elements selected from the group consisting of Fe(III), Ga, and Al, and M represents one or more divalent elements selected from the group consisting of Mg, Mn, Fe(II), Co, Cu, Zn, and Cd), in which the main plane of the RAMO₄ substrate has an off-angle a tilted $\theta a°$ with respect to an M-axis direction from a C-plane, and $0.05° \leq |\theta a| \leq 0.8°$ is satisfied.

There is also provided an RAMO₄ substrate including a single crystal represented by the general formula RAMO₄ (wherein R represents one or more trivalent elements selected from the group consisting of Sc, In, Y, and lanthanide elements, A represents one or more trivalent elements selected from the group consisting of Fe(III), Ga, and Al, and M represents one or more divalent elements selected from the group consisting of Mg, Mn, Fe(II), Co, Cu, Zn, and Cd), in which the main plane of the RAMO₄ substrate has an off-angle b tilted $\theta b°$ with respect to an A-axis direction from a C-plane, and $0.05° \leq |\theta b| \leq 0.4°$ is satisfied.

Advantageous Effects

By use of the RAMO₄ substrate of the present disclosure, it is possible to provide a group III nitride semiconductor layer having satisfactory crystallinity and flatness and implement a device having higher performance than that of a group III nitride semiconductor optical device or electronic device produced by epitaxial growth on a conventional sapphire substrate. Exploiting the properties of such a high-quality group III nitride semiconductor layer formed on the RAMO$_4$ substrate can provide nitride semiconductor optical elements and electronic devices produced by combining various group III nitride semiconductors.

DESCRIPTION OF EMBODIMENTS

The RAMO$_4$ substrate and a group III nitride semiconductor apparatus of the present disclosure will be now described, but the present disclosure is not limited to the following embodiments. A minus sign in a Miller index is represented by an overline on the numerical value in accompanying drawings, and is represented by a minus sign in the following description of the embodiments, for convenience of notation.

1. RAMO$_4$ Substrate

The RAMO$_4$ substrate of the present disclosure is a substrate comprising a single crystal represented by the general formula RAMO$_4$ (wherein R represents one or more trivalent elements selected from the group consisting of Sc, In, Y, and lanthanide elements (atomic number 67 to 71), A represents one or more trivalent elements selected from the group consisting of Fe(III), Ga, and Al, and M represents one or more divalent elements selected from the group consisting of Mg, Mn, Fe(II), Co, Cu, Zn, and Cd), and the main plane thereof has an off-angle tilted with respect to an M-axis direction [1-100] and/or with respect to an A-axis direction [11-20], from a C-plane. In the present disclosure, RAMO$_4$ substrates of which main plane has a different off-angle have been formed, and a group III nitride semiconductor has been epitaxially grown on each main plane. Then, the performance of the group III nitride semiconductor layers has been evaluated to find an off-angle and an off direction appropriate for the RAMO$_4$ substrate. The RAMO$_4$ substrate having an off-angle and an off-direction of the present disclosure is very useful as a hetero substrate for a high-quality group III nitride semiconductor. A ScAlMgO$_4$ substrate, which is a typical example of the RAMO$_4$ substrate, will be now described as an example, but the RAMO$_4$ substrate of the present disclosure is not limited thereto.

Embodiment 1

Figure 1:
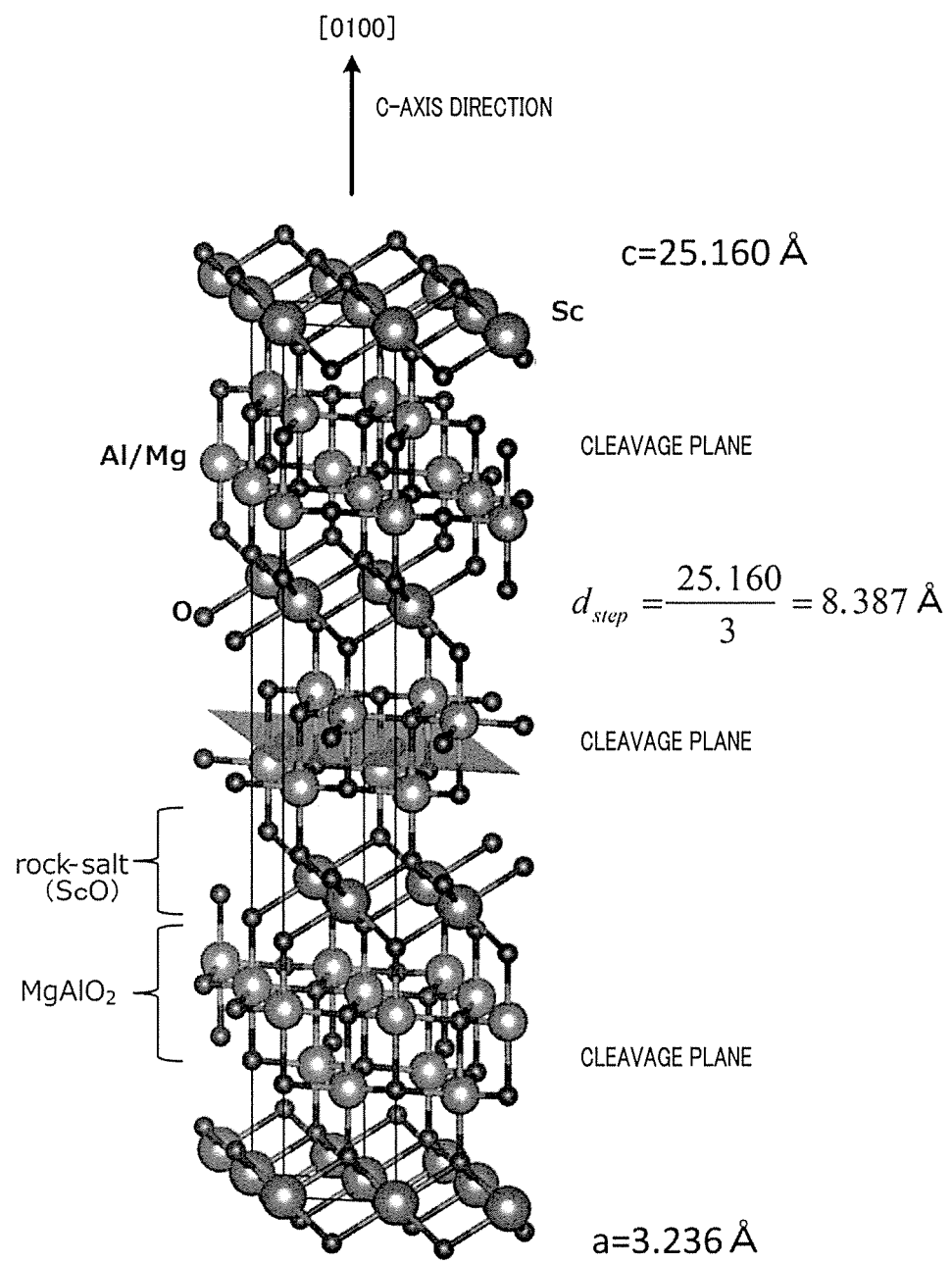
FIG. 1 schematically illustrates the structure of a ScAlMgO$_4$ crystal.
Figure 2:
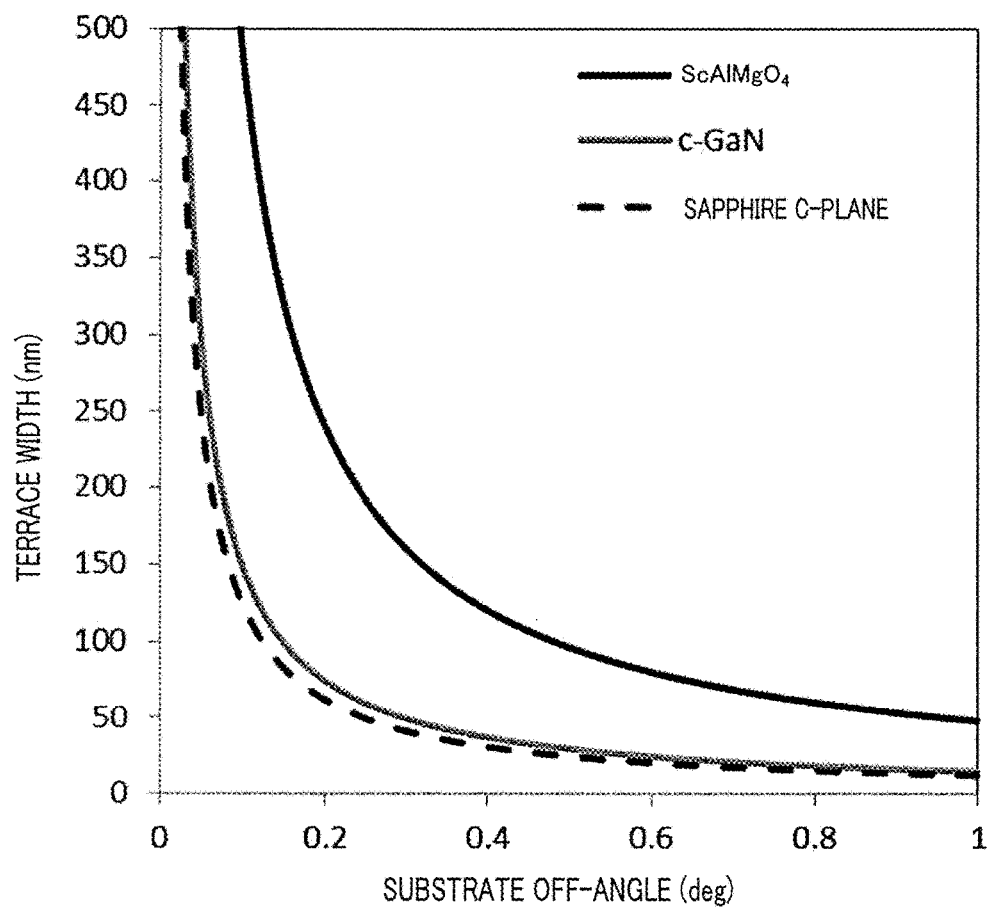
FIG. 2 shows the relation between an off-angle and a terrace width when the off-angle is provided each from a C-plane of the ScAlMgO$_4$ substrate, a C-plane of a GaN substrate, and a C-plane of a sapphire substrate.

The crystal structure of ScAlMgO$_4$ is shown in FIG. 1. The crystal of ScAlMgO$_4$ takes a structure in which a MgAlO$_2$ layer as a hexagonal crystal and a ScO layer having a rock salt structure are layered in a [0001] direction (C-axis direction). A (0001) plane (C plane) formed by common cleavage is constituted by a MgAlO$_2$ layer. In the crystal of ScAlMgO$_4$, the crystal lattice constant (c) in the [0001] direction is 25.160 Å, and a step height, which appears by forming an off-angle, will be 25.160/3=8.387 Å. This step height is a relatively large value, as compared with the step height (2.593 Å) appearing in a GaN substrate, which is a group III nitride, and the step height (2.165 Å) appearing in a sapphire substrate (C-plane). The step height also influences a length parallel to the (0001) plane of the step (terrace width). As shown in FIG. 2, the ScAlMgO$_4$ crystal, even when allowed to have an off-angle equivalent to that of a GaN substrate or sapphire substrate, will have a surface profile having a terrace width longer than that of these substrates.

As aforementioned, in the ScAlMgO$_4$ crystal, the step height, profile, and terrace width observed when an off-angle is provided are all different from those of substrate materials conventionally used, such as a GaN substrate and a sapphire substrate. Thus, the range of the off-angle appropriate for growing a group III nitride semiconductor is also different.

Figure 3:
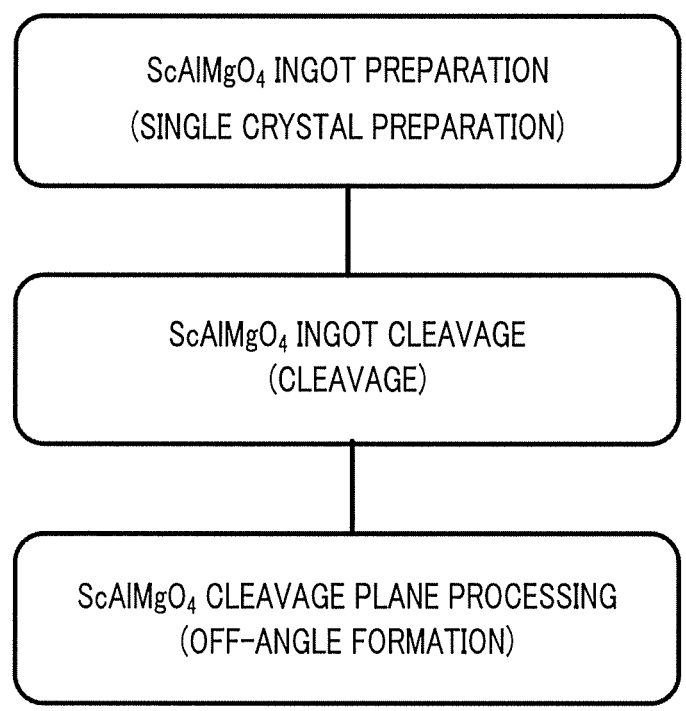
FIG. 3 is a process flow showing a production process of the ScAlMgO$_4$ substrate according to an embodiment of the present disclosure.

The ScAlMgO$_4$ substrate of the present embodiment will be now described with reference to the accompanying drawings. A process flow of a production process of the ScAlMgO$_4$ substrate is shown in FIG. 3. The production process of the ScAlMgO$_4$ substrate includes preparing a ScAlMgO$_4$ single crystal ingot (single crystal preparation), cleaving the ScAlMgO$_4$ single crystal ingot along a (0001) plane to form a substrate (cleavage), and processing a surface of the substrate corresponding to an epitaxial growth surface (off-angle formation).

For example, in the single crystal preparation, a ScAlMgO$_4$ single crystal ingot produced using a high frequency induction heating type Czochralski furnace is provided. As a method for producing an ingot, for example, Sc$_2$O$_3$, Al$_2$O$_3$, and MgO as the starting materials are blended at a predetermined molar ratio, placed in an iridium crucible having a diameter of 100 mm, and melted under heating. Next, a ScAlMgO$_4$ single crystal cut out in the (0001) orientation is used as a seed crystal, which is lowered near the melt in the crucible. The seed crystal is then gradually lowered while rotated at a constant rotational speed. The tip of the seed crystal is brought into contact with the melt, and the seed crystal is raised at a pulling-up speed of 0.5 mm/h while the temperature is gradually lowered. That is, the crystal is grown by pulling it up in the C-axis direction ([0001] direction). After the crystal is pulled up to a desired length, the crystal is cut off from the melt and cooled. This can provide a single crystal ScAlMgO$_4$ ingot having a diameter of 50 mm and a length of 50 mm.

Next, the capability of the ScAlMgO$_4$ single crystal to be cleaved along the (0001) plane is utilized to divide the single crystal ScAlMgO$_4$ ingot by cleavage into a substrate form (cleavage).

Subsequently, as off-angle formation, an irregularity profile having a height of 500 nm or more corresponding to the off-angle is formed on the ScAlMgO$_4$ surface. Then, the applied pressure during polishing is reduced step-wisely to reduce the absolute value of the variation in the applied pressure during polishing. The irregularity profile is gradually reduced while internal cleavage is prevented to form an off-angle on the surface. In off-angle formation, the polishing direction is adjusted so as to bring the off-direction and the off-angle within a desired range.

One example of the off-angle formation is shown below. First, in processing an irregularity profile of 500 nm or more (irregularity formation), grinding is carried out using diamond fixed abrasive grains having a large abrasive grain size. As the abrasive grains, diamond abrasive grains having a grain size of #600 are used, for example. Use of the grains enables the height difference of the irregularities on the processed surface after grinding to be within ±5 μM or less. The processing conditions in the irregularity formation can include a grindstone rotation speed of 1,800 min$^{-1}$, a ScAlMgO$_4$ substrate rotation speed of 100 min$^{-1}$, a processing speed of 0.3 mm/second, and an amount of removal by processing of around 20 μm, for example. Then, gradually removing the irregularities formed in the irregularity formation is carried out (irregularity removal). In this case, by carrying out polishing with the applied pressure reduced step-wisely, irregularities having a height less than 500 nm can be formed while the irregularities having a height of 500 nm or more formed in the irregularity formation are removed. Specifically, polishing can be carried out using a slurry based on colloidal silica, for example, as the abrasive grains and a non-woven fabric pad as a polishing pad at a rotation speed of 60 min$^{-1}$ and an amount of slurry to be supplied of 0.5 ml/minute. In this case, reducing the applied pressure step-wisely from a range of around 15,000 Pa initially to a range of around 3,000 Pa in the end leads to formation of a step height and a terrace width depending on a desired off-angle. Reducing the applied pressure step-wisely in this manner enables the irregularities to be removed without causing an internal cleavage.

Figure 4:
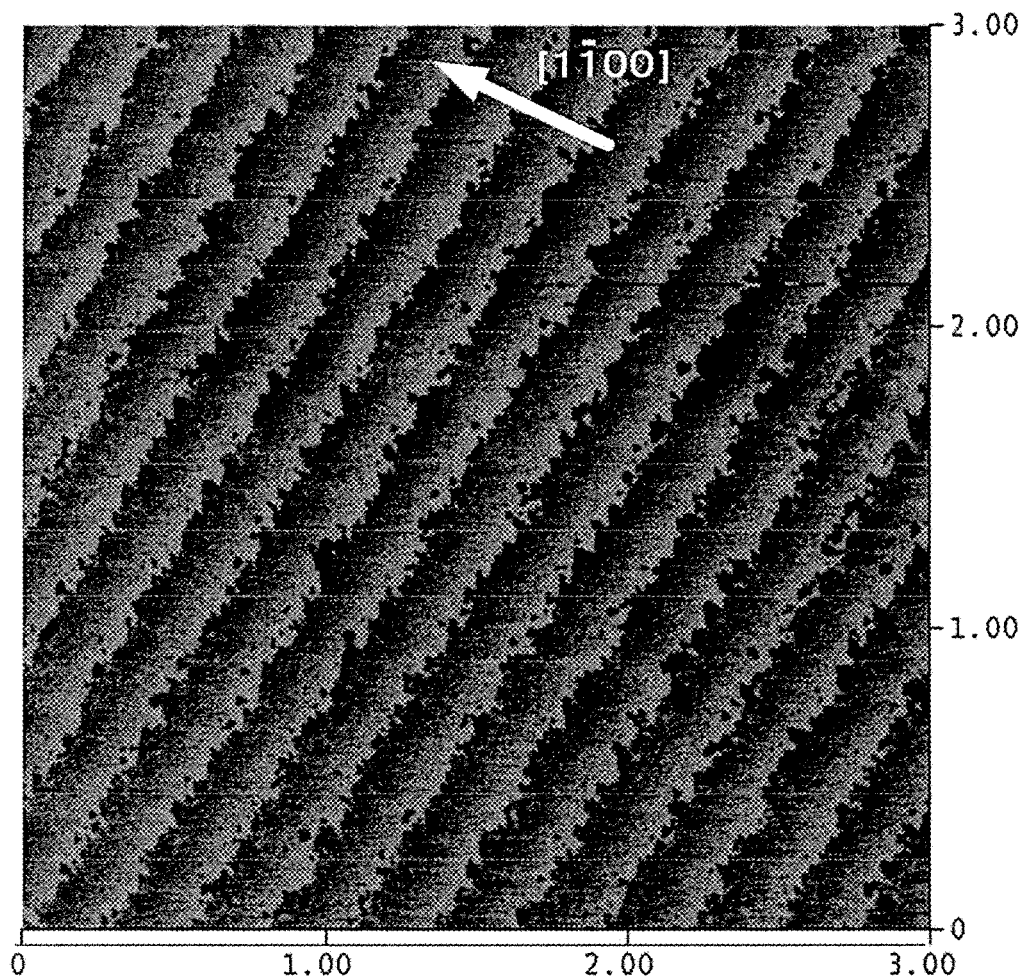
FIG. 4 is an atomic force micrograph of the surface of the ScAlMgO$_4$ substrate of Embodiment 1 of the present disclosure.

A micrograph of the surface of the ScAlMgO$_4$ substrate according to the present embodiment photographed with an atomic force microscope (AFM) is shown in FIG. 4. The ScAlMgO$_4$ substrate was formed such that the off-angle a produced under the aforementioned conditions would be 0.2°. On the ScAlMgO$_4$ substrate surface after the off-angle formation, a periodic structure has been observed, and the substrate has a step height of about 0.8 nm, which is equivalent to the theoretical step height of a ScAlMgO$_4$ crystal. The substrate has a terrace width of around 240 nm, which is substantially equivalent to the off-angle (0.20 to 0.21°) estimated from the graph of FIG. 2. As aforementioned, it is possible to obtain a ScAlMgO$_4$ substrate having a desired off-angle a, via the process in accordance with the process flow of FIG. 3.

Figure 5:
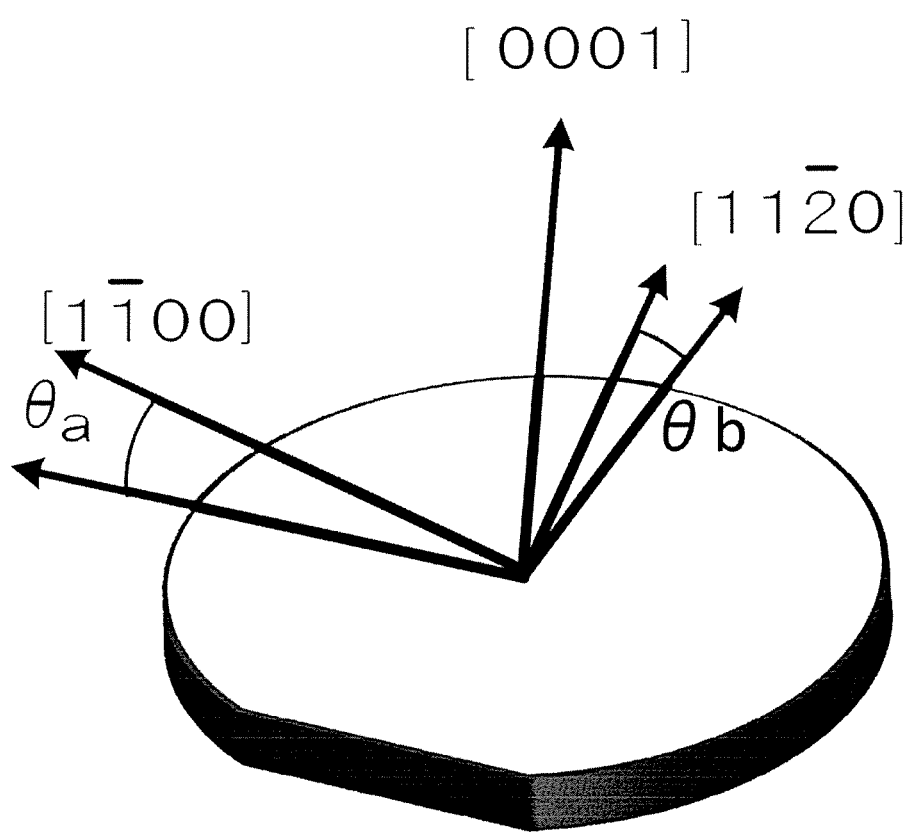
FIG. 5 illustrates angles formed by the main plane of the ScAlMgO$_4$ substrate with an M-axis direction [1-100] and with an A-axis direction [11-20] (off-angle a and off-angle b)

Here, in FIG. 5, the off-direction and off-angle of the ScAlMgO$_4$ substrate are illustrated. In the present disclosure, the off-angle refers to a tilting angle of the main plane of the ScAlMgO$_4$ substrate from the (0001) plane (C-plane). Also in the present disclosure, an off-angle tilted θa° with respect to the direction perpendicular to the M-plane (1-100), that is, the M-axis direction [1-100] is represented as an off-angle a, and an off-angle tilted θb° with respect to the direction parallel to the M-plane (1-100), that is, the A-axis direction [11-20] is represented as an off-angle b.

The ScAlMgO$_4$ substrate of the present embodiment has an off-angle a but has no off-angle b. The off-angle of the ScAlMgO$_4$ substrate according to the present embodiment obtained in FIG. 4 is provided in the direction substantially perpendicular to the M-plane (1-100) (parallel to the M-axis direction [1-100]), and θa is around 0.20°. Meanwhile, the off-angle b, which is in the direction substantially parallel to the M-plane (1-110), is not provided. That is, θb is 0°.

Here, in the present embodiment, the range of the off-angle a of the ScAlMgO$_4$ substrate is preferably 0.05°≤|θa|≤0.8°, more preferably 0.2°≤"θa|≤0.6°. Hereinbelow, the reason will be described.

Figure 6:
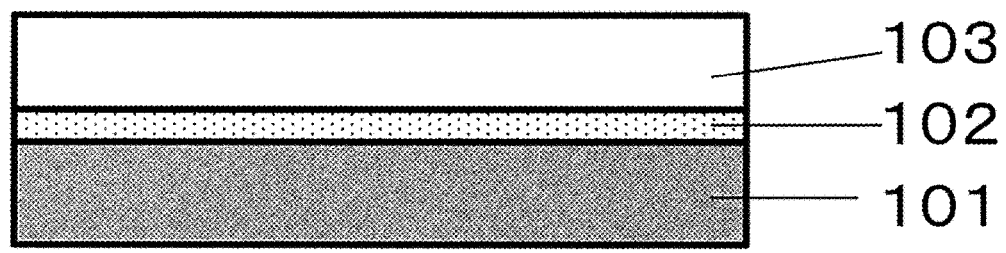
FIG. 6 illustrates a laminate structure including the ScAlMgO$_4$ substrate of Embodiment 1 of the present disclosure, a buffer layer, and a group III nitride semiconductor.

The off-angle a of the ScAlMgO$_4$ substrate of the present embodiment was evaluated by forming a group III nitride semiconductor layer on the ScAlMgO$_4$ substrate. In the case of forming the group III nitride semiconductor layer, as shown in FIG. 6, buffer layer 102 was formed first on ScAlMgO$_4$ substrate 101, and then, group III nitride semiconductor layer 103 was formed thereon.

Buffer layer 102 and group III nitride semiconductor layer 103 in FIG. 6 were formed as follows. First, on ScAlMgO$_4$ substrate 101 having an off-angle, a group III nitride semiconductor was epitaxially grown using a metal organic chemical vapor deposition (MOCVD) method. As group III raw material, trimethylgallium (TMG), trimethylindium (TMI), and trimethylaluminum (TMA) were used, and as group V raw material, ammonium (NH$_3$) gas was used. As carrier gas, hydrogen or nitrogen was used. The ScAlMgO$_4$ substrate introduced in a MOCVD furnace was subjected to heat cleaning in hydrogen atmosphere at 1,100° C. for 10 minutes. Carbon smudges and the like adhering to the ScAlMgO$_4$ substrate surface were removed by this heat cleaning. Thereafter, the temperature of the substrate surface was lowered to 425° C., and buffer layer 102 was deposited thereon at the low temperature. The film thickness and the composition of buffer layer 102 were adjusted with the growth time of buffer layer 102 and the ratio of the group III raw materials to be supplied. After formation of buffer layer 102, the temperature of ScAlMgO$_4$ substrate 101 was raised to 1,125° C. to epitaxially grow group III nitride semiconductor layer 103. In the present embodiment, GaN was used for buffer layer 102, and the film thickness was set to 30 nm. Group III nitride semiconductor layer 103 on buffer layer 102 also included GaN. Additionally, the growth speed of group III nitride semiconductor layer 103 was set to 3 microns/h, and its film thickness was set to 2 μm.

Figure 7:
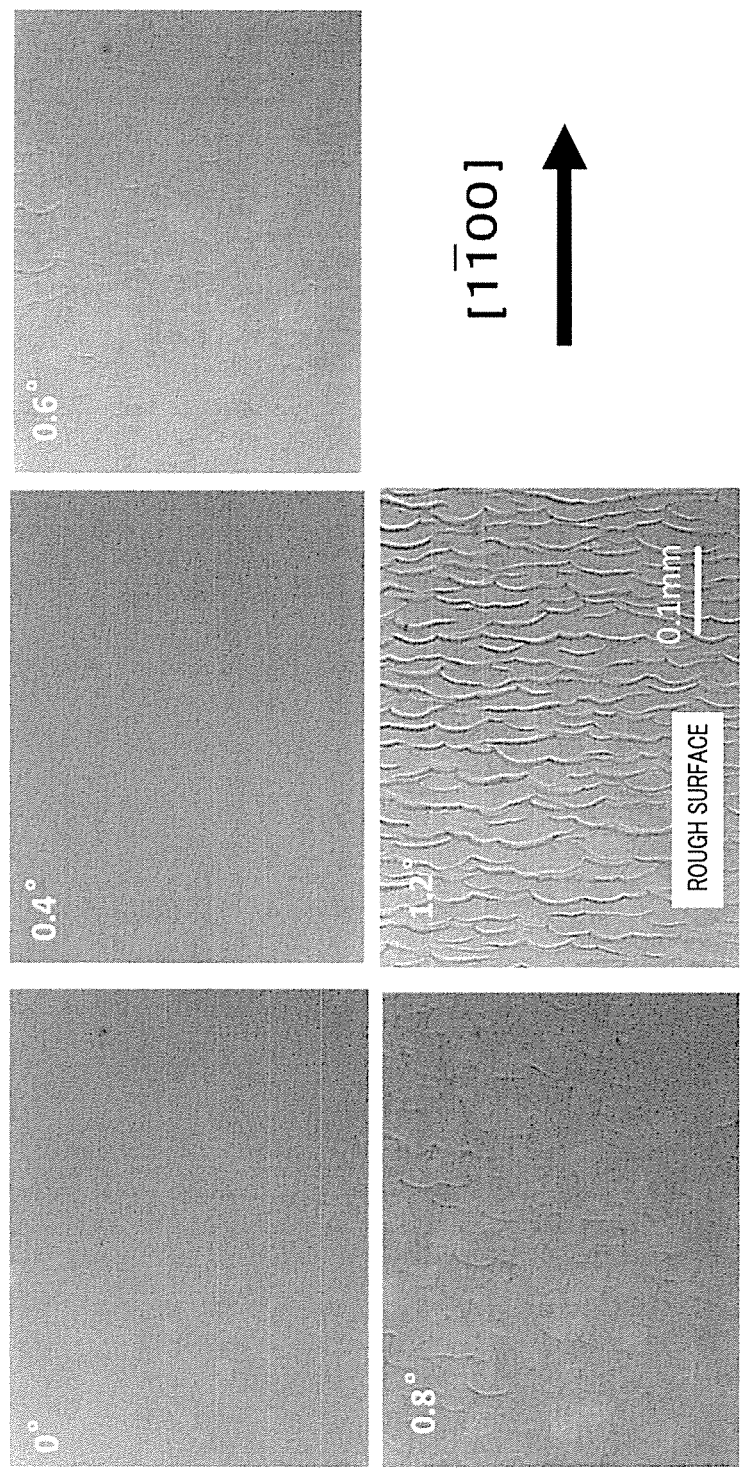
FIG. 7 are optical micrographs of the surface of a group III nitride semiconductor layer produced on the main plane of the ScAlMgO$_4$ substrate of Embodiment 1 of the present disclosure.
Figure 13:
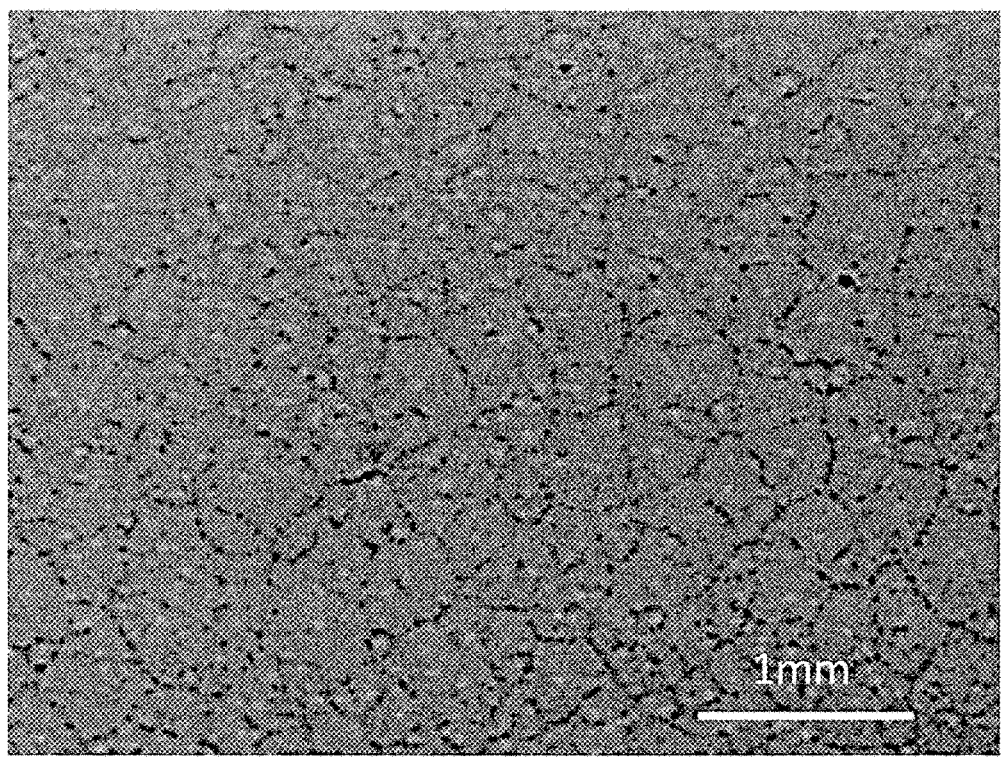
FIG. 13 is a low-magnification optical micrograph of the surface of a group III nitride semiconductor layer formed on a (0001) plane of a conventional ScAlMgO$_4$ substrate.

In FIG. 7, there are shown optical micrographs of the surface when buffer layer (GaN layer) 102 and group III nitride semiconductor layer (GaN film) 103 aforementioned were formed on the ScAlMgO$_4$ substrate of which main surface has an off-angle a tilted with respect to the M-axis direction ([1-100] direction) from the C-plane (0001). That is, there are shown optical micrographs of a GaN film surface after the GaN film was epitaxially grown on the main plane of the ScAlMgO$_4$ substrate. In FIG. 7, the off-angle θa ranges from 0 to 1.2°. The off-angle θb is 0° in all the micrographs. From the micrographs of FIG. 7, it can be seen that satisfactory flat surface morphology is achieved when θa is from 0.4° to 0.8°. In contrast, when the off-angle a is large, that is, when θa is 1.2°, corrugated surface morphology perpendicular to the M-axis direction as the off-direction was observed. It is conceived that this is due to the influence of bunching, which is assembling and multiple-staging of steps. The surface having θa=0° as a conventional example is seen as if it is a flat surface in FIG. 7, but rough surface having large grains on the group III nitride layer surface was observed in a low-magnification optical micrograph, as shown in FIG. 13. In contrast, in the case where θa of 0.05° or more was formed, rough surface having such large grains was eliminated, and the group III nitride layer (GaN film) had a satisfactory surface.

Figure 8:
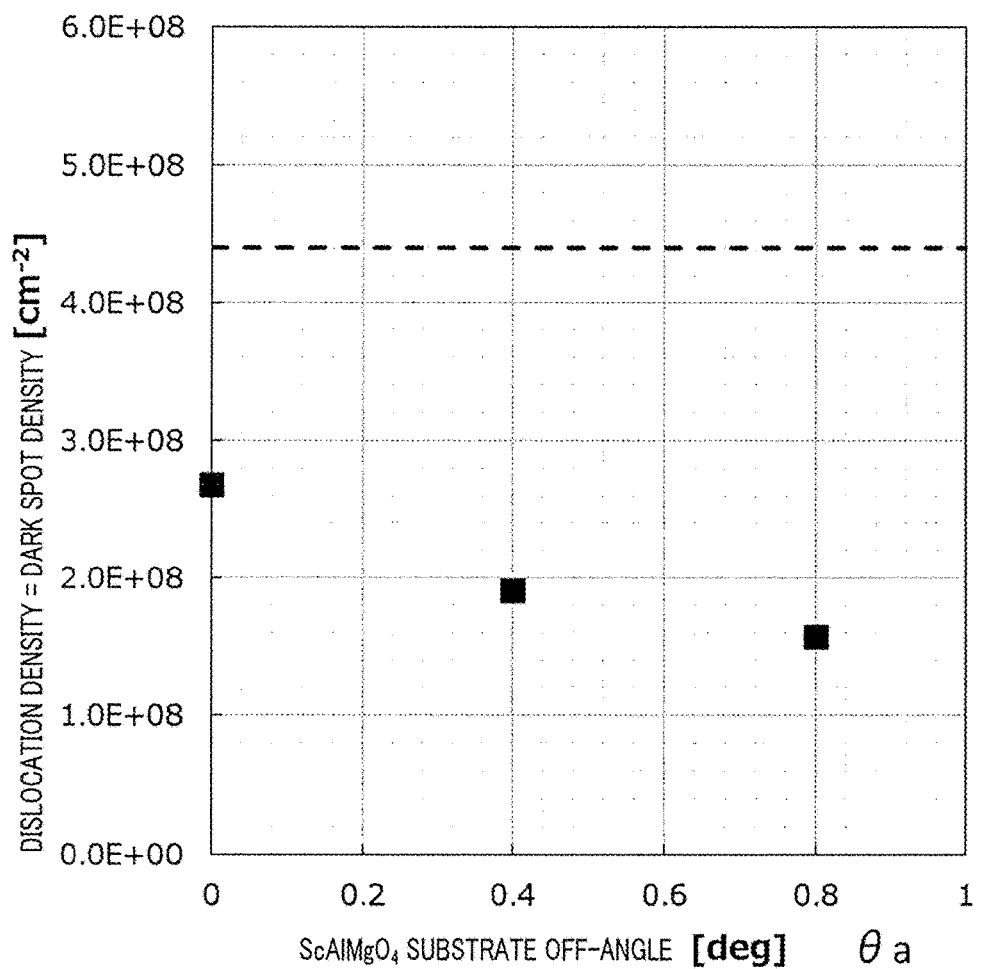
FIG. 8 shows a correlation of the off-angle a (θa) possessed by the main plane of the ScAlMgO$_4$ substrate according to Embodiment 1 of the present disclosure with the dislocation density of the surface of a group III nitride semiconductor layer to be formed on the main plane.

In FIG. 8, there is shown a correlation graph of the off-angle (θa) of the main plane of the ScAlMgO$_4$ substrate with the dislocation density of the surface of a GaN film formed on the substrate obtained by cathode luminescence (CL) measurement. In FIG. 8, the dislocation density when a GaN film is produced on a sapphire substrate (off-angle θa=0.14°) (dotted line) is shown as a comparison. From FIG. 8, it can be seen that the case where a GaN film is formed on the ScAlMgO$_4$ substrate has a dislocation density lower than that in the case where a GaN film is produced on a sapphire substrate. That is, it can be said that a satisfactory GaN crystal is formed by epitaxial growth. The dislocation density is reduced in the case where the main plane of the ScAlMgO$_4$ substrate has an off-angle a, as compared with that in the case where the main plane of the ScAlMgO$_4$ substrate has no off-angle a (θa=0°). That is, it can be seen that formation of an off-angle further allows the GaN film to exhibit satisfactory crystallinity.

As aforementioned, considering the surface flatness and crystallinity of the GaN film, it is preferred to satisfy $0.05°≤|θa|≤0.8°$ when an off-angle a is provided. In the present embodiment, an investigation was made by using GaN as the group III nitride semiconductor and setting the growth temperature of the GaN to 1,125° C. In the case where AlGaInN is used as the group III nitride semiconductor or the like, the growth temperature is adjusted depending on the composition, and for example, a temperature around 700 to 1,170° C. will be the appropriate growth temperature. When the group III nitride semiconductor layer is grown at a low growth temperature of 700° C., for example, the diffusion length of the raw material is more suppressed compared with the case of a high temperature. Thus, when the off-angle a (θa) becomes smaller than 0.2°, that is, when the terrace width broadens, the raw material may not reach the step edge, nuclei may be formed on the terrace, and a surface having large grains as seen from FIG. 13 may occur. Alternatively, at a high growth temperature (1,170° C., for example), diffusion of the raw material is facilitated, and thus, bunching, in which the raw material assembles on a specific step, becomes likely to occur. When the off-angle a (θa) becomes larger than 0.6°, a corrugated rough surface may be seen. Accordingly, the range of θa described above is more preferably $0.2°≤|θa|≤0.6°$.

Embodiment 2

Subsequently, the ScAlMgO$_4$ substrate of Embodiment 2 will be described. In the ScAlMgO$_4$ substrate of the present embodiment, the main plane has an off-angle b (θb) in a direction substantially parallel to the M-plane (1-100) from the C-plane (0001) plane but has no off-angle a, that is, the main plane has an off-angle b tilted θb° with respect to the A-axis direction [11-20] from the C-plane (0001). A method for producing a ScAlMgO$_4$ substrate having such an off-angle b is the same as the method for producing a ScAlMgO$_4$ substrate of Embodiment 1 aforementioned. However, in the aforementioned off-angle formation, the off-direction and the off-angle are adjusted.

The preferable range of the off-angle b in the ScAlMgO$_4$ substrate of the present embodiment is $0.05°≤|θb|≤0.4°$, more preferably $0.1°≤|θb|≤0.4°$, still more preferably $0.1°≤|θb|≤0.4°$. Hereinbelow, the reason will be described.

Figure 9:
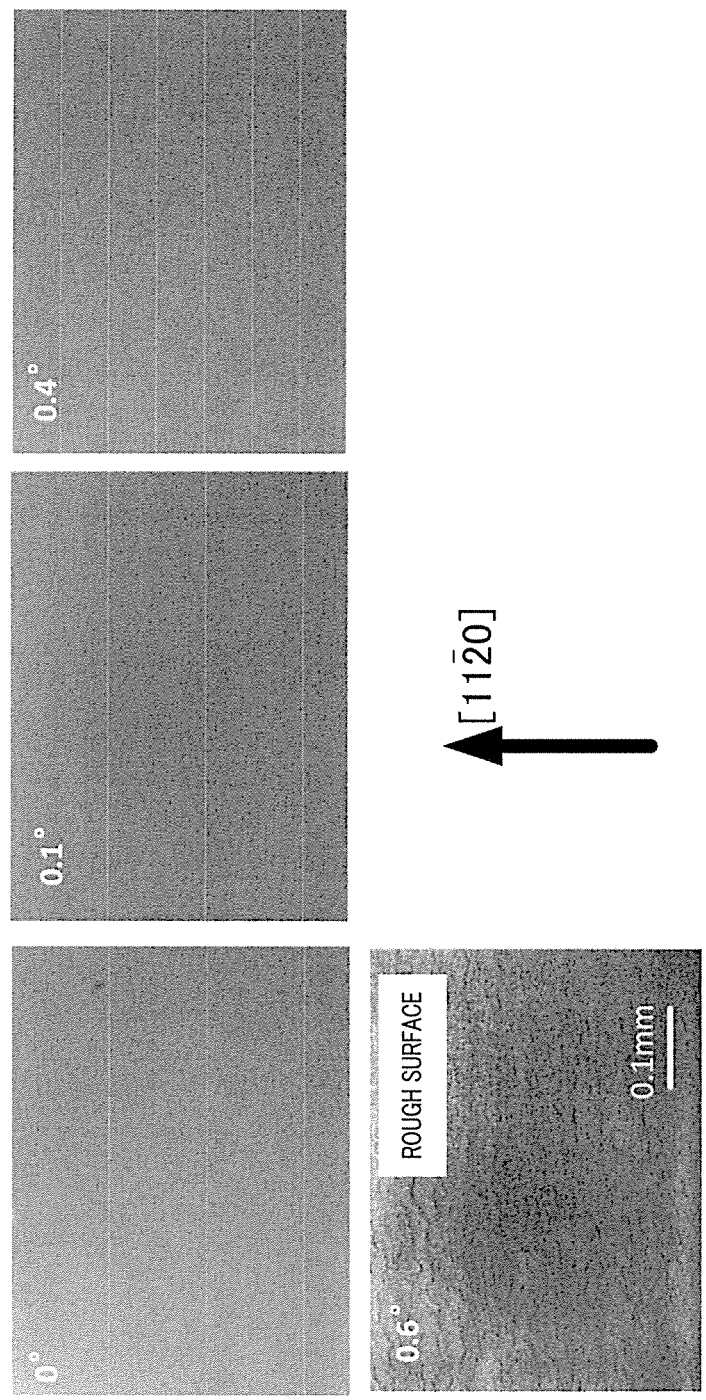
FIG. 9 are optical micrographs of the surface of a group III nitride semiconductor layer produced on the main plane of the ScAlMgO$_4$ substrate of Embodiment 2 of the present disclosure.

As in Embodiment 1, a group III nitride semiconductor layer (GaN film) was epitaxially grown on the main plane of the ScAlMgO$_4$ substrate by a MOCVD method. The epitaxial growth conditions were the same as in Embodiment 1 (thickness of buffer layer 102: 30 nm, thickness of group III nitride semiconductor layer 103: 2 μm). In FIG. 9, there are shown optical micrographs of the GaN film surface when group III nitride semiconductor layer (GaN film) 103 was formed on the ScAlMgO$_4$ substrate having an off-angle b. In FIG. 9, the off-angle θb ranges from 0 to 0.6°. Meanwhile, the off-angle θa is 0° in all the micrographs. Note that the optical micrograph of θb=0° is the same as the micrograph of θa=0° in FIG. 7. In the GaN film, rough surface having large grains on the GaN film surface was observed in a low-magnification optical micrograph, as shown in FIG. 13. In contrast, when θb is 0.05° or more and 0.4° or less, satisfactory surface morphology was identified. Meanwhile, for θb=0.6°, corrugated surface morphology was observed perpendicularly to the A-axis direction as the off-direction, and the surface was rough due to bunching. From the above results, it can be said that a satisfactory GaN film can be obtained with $0.05°≤|θb|≤0.4°$. As a result of an investigation carried out on θb in the growth temperature range of the group III nitride semiconductor from 700 to 1,170° C. in the same manner as in Embodiment 1, it was possible to obtain a satisfactory group III nitride semiconductor layer when θb was $0.1°≤|θb|≤0.4°$. In the case of θb=0.4°, growing AlGaN or the like at a high-temperature region (1,170° C.) tends to cause slight bunching on the surface. For this reason, θb≠0.4, that is, $0.1°≤|θb|<0.4°$ is more preferred.

Embodiment 3

Subsequently, the ScAlMgO$_4$ substrate of Embodiment 3 will be described. In the ScAlMgO$_4$ substrate of the present embodiment, the main plane is tilted θa° with respect to the M-axis direction and θb° with respect to the A-axis direction, from the C-plane (0001 plane). That is, the substrate includes the compound off-angle of the off-angle a and the off-angle b. A method for producing a ScAlMgO$_4$ substrate having such an off-angle a and an off-angle b is the same as in Embodiment 1 aforementioned. However, in the aforementioned off-angle formation, the off-direction and the off-angle are adjusted.

In the ScAlMgO$_4$ substrate of the present embodiment, the range of the off-angle a is preferably $0.05°≤|θa|≤0.8°$, more preferably 0.2°≤|θa|≤0.6°. The range of the off-angle b is preferably 0.05°≤|θb|≤0.4°, more preferably 0.1°≤|θb|≤0.4°, still more preferably 0.1°≤|θa|<0.4°. Hereinbelow, the reason will be described.

As in Embodiment 1, group III nitride semiconductor layer (GaN film) 103 was epitaxially grown on the main plane of the ScAlMgO$_4$ substrate by a MOCVD method. The epitaxial growth conditions, film thickness and the like were the same as in Embodiment 1. The θa and θb investigated and surface morphology results are shown in the following Table 1.

The investigation was carried out on (θa, θb)=(0.1°, 0.05°), (0.1°, 0.1°), (0.2°, 0.05°), (0.2°, 0.1°), (0.4°, 0.05°), (0.4°, 0.1°), (0.6°, 0.05°), (0.6°, 0.1°), (0.8°, 0.05°), (0.8°, 0.1°), (1.2°, 0.1°), (0.05°, 0.4°), (0.1°, 0.4°), and (0.1°, 0.6°). The surface morphology of the GaN film obtained was also observed. The case where the surface morphology was satisfactory even if the epitaxial growth temperature was 700 to 1,170° C. is represented by A, the case where the surface morphology was slightly degraded at an epitaxial growth temperature of 700° C. or 1,170° C. but the surface morphology was satisfactory at 1,125° C. is represented by B, and the case where corrugated rough morphology was observed is represented by C. From Table 1, it was confirmed that a satisfactory GaN film can be obtained on a ScAlMgO$_4$ substrate having an off-angle a and an off-angle b provided that the substrate had a compound off-angle within the range specified in Embodiments 1 and 2.

TABLE 1

| θa (°) | θb (°) | Surface morphology |
|---|---|---|
| 0.1 | 0.05 | B |
| 0.1 | 0.1 | B |
| 0.2 | 0.05 | B |
| 0.2 | 0.1 | A |
| 0.4 | 0.05 | B |
| 0.4 | 0.1 | A |
| 0.6 | 0.05 | B |
| 0.6 | 0.1 | A |
| 0.8 | 0.05 | B |
| 0.8 | 0.1 | B |
| 1.2 | 0.1 | C |
| 0.05 | 0.4 | B |
| 0.1 | 0.4 | B |
| 0.1 | 0.6 | C |

As shown in Table 1, no influence of magnitude relation between an off-angle a and an off-angle b was observed. This suggests that, in GaN growth on a ScAlMgO$_4$ substrate having a compound off-angle, incorporation of adsorbed atoms into M-plane steps existing in the direction substantially perpendicular to the M-plane ((1-100) plane) from the C-plane ((0001) plane) is approximately equivalent to incorporation of adsorbed atoms into A-plane steps existing in the direction substantially parallel to the M-plane ((1-100) plane) from the C-plane ((0001) plane).

Figure 10:
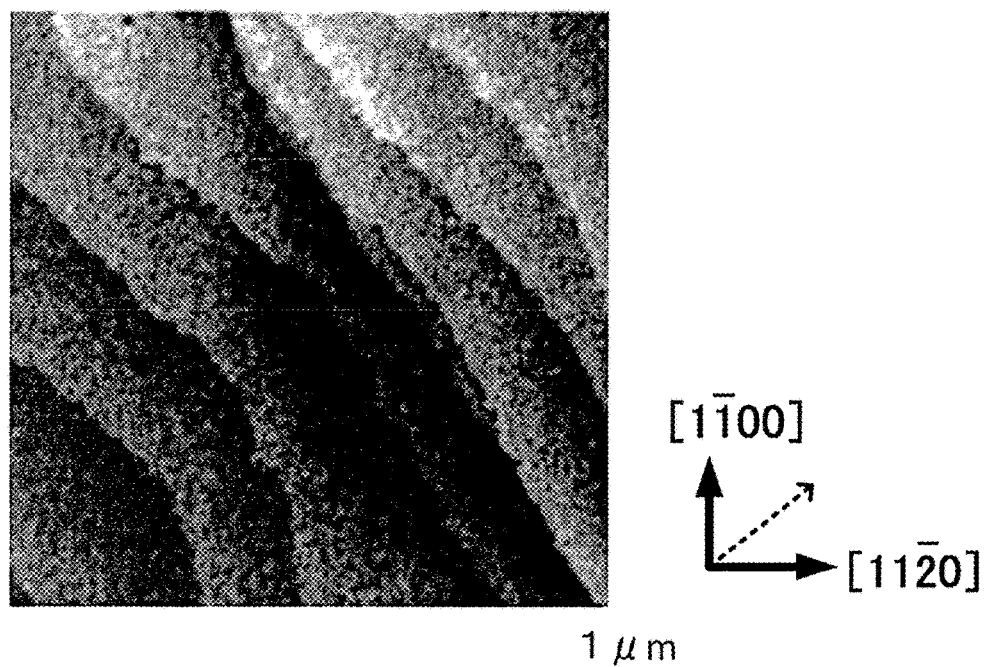
FIG. 10 is an atomic force micrograph of the surface of a group III nitride semiconductor layer produced on the main plane of the ScAlMgO$_4$ substrate (off-angles (θa, θb)=(0.1°, 0.1°)) of Embodiment 3 of the present disclosure.

In FIG. 10, there is shown an atomic force micrograph of the surface after a GaN film is epitaxially grown on the ScAlMgO$_4$ substrate having (θa, θb)=(0.1°, 0.1°). From FIG. 10, it can be seen that an approximately linear step profile is observed. It can be also identified that the linear steps are formed to perpendicularly intersect with the direction forming an angle of 45° with respect to the A-axis direction [11-20] from the M-axis direction [1-100] and have an orientation corresponding to the compound off-angle. The proportions of the M-plane steps and the A-plane steps to the steps to be formed on the GaN surface on the ScAlMgO$_4$ substrate having a compound off-angle (θa, θb)=(0.1°, 0.1°) shown in FIG. 10 are each 50%. When the GaN incorporation speed (growth speed) is different between the M-plane steps and the A-plane steps, it is expected that the step profile to appear will be distorted from a linear profile or tilted from the compound direction. However, since both the direction and the linearity are satisfactory, it is confirmed that there is no or extremely small difference of the GaN incorporation speed between the M-plane steps and the A-plane steps.

The results of FIG. 10 represent that, in GaN epitaxial growth on the ScAlMgO$_4$ substrate having a compound off-angle, a satisfactory GaN film can be obtained in an off-angle region that satisfies 0°<|θa|≤0.8° and 0°<|θb|≤0.4°. As aforementioned, formation of the group III nitride semiconductor layer at around 700 to 1,170° C. is carried out preferably within an off-angle region that satisfies 0.2°≤|θa|≤0.6° and 0.1≤|θb|≤0.4°, represented by A in Table 1. Within such a region, it is possible to obtain a satisfactory group III nitride semiconductor layer having flatness and crystallinity simultaneously without causing disruption in the direction and linearity of the step on the ScAlMgO$_4$ substrate. In the case of θb=0.4, growing AlGaN or the like at a high-temperature region (1,170° C.) may cause slight bunching on the surface. For this reason, θb≠0.4, that is, 0.2°≤|θa|≤0.6° and 0.1°≤|θb|<0.4° are more preferred.

(Others)

In each of Embodiments 1 to 3 aforementioned, the performance of a ScAlMgO$_4$ substrate was verified by forming a GaN film having a thickness of 2 μm. When the thickness of a group III nitride semiconductor layer to be formed on the main plane of the ScAlMgO$_4$ substrate is 1 μm or more, the surface of the group III nitride semiconductor layer is flattened, and thus, a similar effect can be obtained. It is also possible to form a GaN thick film having a thickness of 0.1 mm or more on the main plane of the ScAlMgO$_4$ substrate using an HVPE method or the like.

In Embodiments 1 to 3 aforementioned, the ScAlMgO$_4$ substrate surface is subjected to whole-surface off-angle processing, and a group III nitride semiconductor is epitaxially grown thereon. After whole-surface off-angle processing is carried out, a partial region of the ScAlMgO$_4$ substrate may be masked with SiNx or SiO$_2$, an irregularity profile may be additionally processed on the ScAlMgO$_4$ substrate, or the like. Even with such a substrate, when the main plane on which a group III nitride semiconductor layer is to be grown has been off-angle processed, it is possible to achieve a similar effect in the case where a group III nitride semiconductor is epitaxially grown.

In Embodiments 1 to 3 aforementioned, the group III nitride semiconductor layer has been formed by the MOCVD method. As the epitaxial growth method, any of an HYPE method, OVPE method, sputtering method, MBE method and the like may be used. One of these methods may be carried out singly or two or more of these may be used in combination. In any case, it is possible to achieve a similar effect as described above.

In Embodiments 1 to 3 aforementioned, of substrates comprising a single crystal represented by the general formula RAMO$_4$, only the substrate obtained from a ScAlMgO$_4$ single crystal has been described. The present disclosure is not limited thereto. The substrate of the present disclosure may be any substrates comprising a substantially single crystal material represented by the general formula RAMO$_4$. The term "substantially single crystal material" refers to crystalline solid that contains 90 at % or more of RAMO$_4$ constituting the main plane (epitaxial growth surface of the group III nitride semiconductor layer) and in which, when a crystal axis is focused on, the axis has the same orientation in any portion of the epitaxial growth surface. However, crystals in which the orientation of a crystal axis is locally altered and crystals including local lattice defects are also treated as single crystals. Note that O is oxygen. It is desirable that R be Sc, A be Al, and M be Mg.

The group III element metal constituting a group III nitride semiconductor to be formed on the $RAMO_4$ substrate is most preferably gallium (Ga), but may be, for example, aluminum (Al), indium (In), thallium (Tl) or the like. One of these may be used singly or two or more of these may be used in combination. For example, as the group III element metal, at least one selected from the group consisting of aluminum (Al), gallium (Ga), and indium (In) may be used. In this case, the composition of the group III nitride semiconductor crystal to be produced is represented by $Al_sGa_tIn_{\{1-(s+t)\}}N$ (wherein $0 \leq s \leq 1$, $0 \leq t \leq 1$, $s+t \leq 1$). The group III element metal may be subject to reaction in the presence of, for example, a dopant material or the like. Examples of the dopant include, but are not particularly limited to, monosilane ($SiH_4$), germanium oxide (for example, $Ge_2O_3$, $Ge_2O$, and the like), and cyclopentadienyl magnesium (CP2Mg).

2. Group III Nitride Semiconductor Apparatus

Figure 11:
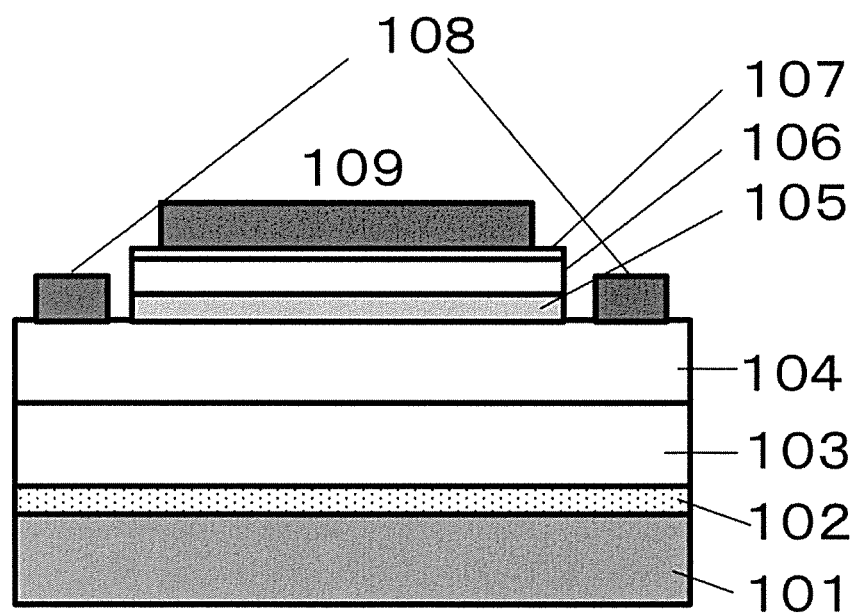
FIG. 11 illustrates the structure of an LED including a ScAlMgO$_4$ substrate according to an embodiment of the present disclosure.

A group III nitride semiconductor apparatus including the $RAMO_4$ substrate aforementioned will be described. The group III nitride semiconductor apparatus may be a group III nitride semiconductor LED device as shown in FIG. 11, for example. The group III nitride semiconductor apparatus is not limited to LED devices, and examples thereof can include semiconductor devices such as LDs and electronic devices for high frequency and high-power applications.

An LED device produced actually using the $RAMO_4$ substrate ($ScAlMgO_4$ substrate) described above will be now described. First, on $ScAlMgO_4$ substrate 101 having an off-angle a and/or an off-angle b, buffer layer 102 was formed by a MOCVD method, and undoped GaN layer (group III nitride semiconductor layer) 103 was further formed by epitaxial growth. Furthermore, n-GaN layer (n-group III nitride semiconductor layer) 104, InGaN active layer 105, p-GaN layer (p-group III nitride semiconductor layer) 106, and p-contact layer 107 were sequentially layered. As Si raw material, which is a donor impurity, monosilane ($SiH_4$) was used, and as Mg raw material, which is an acceptor impurity, cyclopentadienyl magnesium (CP2Mg) was used. The thicknesses of buffer layer 102 and undoped GaN layer 103 were set to 30 nm and 3 μm, respectively. The thicknesses of n-GaN layer 104, p-GaN layer 106, and p-contact layer 107 were set to 3 μm, 100 nm, and 50 nm, respectively. As InGaN active layer 105, an InGaN quantum well was used. Epitaxial growth was carried out by setting the growth temperature to 717° C. and the film thickness to 3 nm such that the emission wavelength was around 450 nm. On the produced LED device, n-electrode 108 was formed on n-GaN layer 104 and p-electrode 109 was formed on p-contact layer 107, respectively from the surfaces. The size of the LED was set to 0.8 mm.

Figure 12:
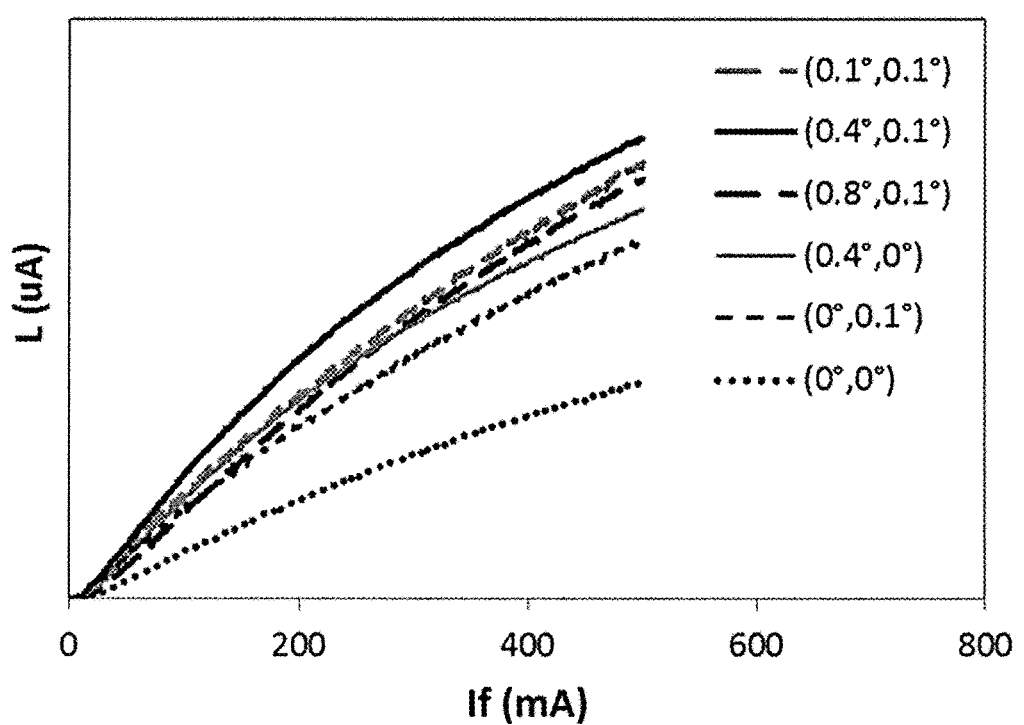
FIG. 12 shows I-L characteristics of the LED produced using the ScAlMgO$_4$ substrate according to an embodiment of the present disclosure.

The off-angles of $ScAlMgO_4$ substrates 101 having an off-angle were ($\theta a$, $\theta b$)=(0.1°, 0.1°), (0.4°, 0.1°), (0.8°, 0.1°), (0.4°, 0°), and (0°, 0.1°). In FIG. 12, the optical output characteristics (I-L characteristics) of an LED produced when a current is injected are shown. FIG. 12 also shows the characteristics of a $ScAlMgO_4$ substrate having ($\theta a$, $\theta b$)= (0°, 0°) as a conventional example. From FIG. 12, when an LED device is produced using a $ScAlMgO_4$ substrate having an off-angle(s), it can be seen that the device exhibits satisfactory I-L characteristics as light emission characteristics, compared with that of a conventional LED device. Compared with the case where the main plane of the $ScAlMgO_4$ substrate has either one of the off-angle a or the off-angle b, more satisfactory light output was identified in an LED device having a compound off-angle (off-angle a and off-angle b). For the LED device having a compound off-angle, the most intense emission was identified in the LED within the preferred range in Embodiment 3, that is, when the main plane of the $ScAlMgO_4$ substrate had off-angles ($\theta a$, $\theta b$)=(0.4°, 0.1°), which satisfy $0.2° \leq |\theta a| \leq 0.6°$ and $0.1° \leq |\theta b| < 0.4°$. As a result, it can be confirmed that the $ScAlMgO_4$ substrate in which the main plane has the aforementioned off-angles is very useful for production of a high-performance device.

The performance of the group III nitride semiconductor apparatus was confirmed using an LED in the above, and laser diodes (LDs) can be similarly allowed to have higher performance using the $RAMO_4$ substrate aforementioned. Electronic devices also can be allowed to have higher performance because it is possible to produce devices having a high-quality group III nitride semiconductor layer having a low dislocation density as shown in FIG. 8.

INDUSTRIAL APPLICABILITY

The substrate having an off-angle according to the present disclosure can be produced as a hetero substrate which has a small lattice mismatch with a group III nitride semiconductor and with which a high-quality group III nitride semiconductor film can be produced. Production of a group III nitride device on the substrate enables a high-quality and high-performance group III nitride device to be provided.

REFERENCE SIGNS LIST

101 $RAMO_4$ ($ScAlMgO_4$) substrate
102 Buffer layer
103 Group III nitride semiconductor layer (undoped GaN layer)
104 n-Group III nitride semiconductor layer (n-GaN layer)
105 InGaN active layer
106 p-Group III nitride semiconductor layer (p-GaN layer)
107 p-Contact layer
108 n-Electrode
109 p-Electrode

The invention claimed is:

1. An $RAMO_4$ substrate comprising a single crystal represented by a general formula $RAMO_4$ wherein R represents one or more trivalent elements selected from a group consisting of Sc, In, Y, and lanthanide elements, A represents one or more trivalent elements selected from a group consisting of Fe(III), Ga, and Al, M represents one or more divalent elements selected from a group consisting of Mg, Mn, Fe(II), Co, Cu, Zn, and Cd, and O represents Oxygen,
wherein a main plane of the $RAMO_4$ substrate has an off-angle a, tilted $\theta a°$, with respect to an M-axis direction from a C-plane, and $0.05° \leq |\theta a| \leq 0.8°$ is satisfied.

2. An $RAMO_4$ substrate comprising a single crystal represented by a general formula $RAMO_4$ wherein R represents one or more trivalent elements selected from a group consisting of Sc, In, Y, and lanthanide elements, A represents one or more trivalent elements selected from a group consisting of Fe(III), Ga, and Al, M represents one or more divalent elements selected from a group consisting of Mg, Mn, Fe(II), Co, Cu, Zn, and Cd, and O represents Oxygen, wherein a main plane of the $RAMO_4$ substrate has an off-angle b, tilted θb°, with respect to an A-axis direction from a C-plane, and $0.05° \leq |θb| \leq 0.4°$ is satisfied.

3. The $RAMO_4$ substrate according to claim 1, wherein the main plane of the $RAMO_4$ substrate has the off-angle a, tilted θa°, with respect to the M-axis direction from the C-plane, and $0.05° \leq |θa| \leq 0.8°$ is satisfied, and the main plane of the $RAMO_4$ substrate has an off-angle b, tilted θb°, with respect to the A-axis direction from the C-plane, and $0.05° \leq |θb| \leq 0.4°$ is satisfied.

4. The $RAMO_4$ substrate according to claim 3, wherein the main plane of the $RAMO_4$ substrate has the off-angle a and the off-angle b satisfying $0.2° \leq |θa| \leq 0.6°$ and $0.1° \leq |θb| \leq 0.4°$, respectively.

5. The $RAMO_4$ substrate according to claim 2, wherein $θb \neq 0.4$.

6. The $RAMO_4$ substrate according to claim 1, wherein R is Sc, A is Al, and M is Mg in the general formula.

7. The $RAMO_4$ substrate according to claim 2, wherein R is Sc, A is Al, and M is Mg in the general formula.

8. The $RAMO_4$ substrate according to claim 1, wherein a group III nitride semiconductor is disposed on the main plane.

9. The $RAMO_4$ substrate according to claim 8, wherein the group III nitride semiconductor is GaN.

10. The $RAMO_4$ substrate according to claim 2, wherein a group III nitride semiconductor is disposed on the main plane.

11. The $RAMO_4$ substrate according to claim 10, wherein the group III nitride semiconductor is GaN.

12. A group III nitride semiconductor apparatus comprising:
the $RAMO_4$ substrate according to claim 1, and
a group III nitride semiconductor element disposed on the $RAMO_4$ substrate.

13. A group III nitride semiconductor apparatus comprising:
the $RAMO_4$ substrate according to claim 2, and
a group III nitride semiconductor element disposed on the $RAMO_4$ substrate.

14. The group III nitride semiconductor apparatus according to claim 12, wherein the group III nitride semiconductor element is an optical device or electronic device.

15. The group III nitride semiconductor apparatus according to claim 13, wherein the group III nitride semiconductor element is an optical device or electronic device.

* * * * *